(12) United States Patent
Cojocaru

(10) Patent No.: US 7,132,901 B2
(45) Date of Patent: Nov. 7, 2006

(54) VOLTAGE CONTROLLED OSCILLATOR WITH VARACTOR-LESS TUNING

(75) Inventor: Christian Cojocaru, Ottawa (CA)

(73) Assignee: Skyworks Solutions, Inc., Irvine, CA (US)

( * ) Notice: Subject to any disclaimer, the term of this patent is extended or adjusted under 35 U.S.C. 154(b) by 34 days.

(21) Appl. No.: 10/972,037

(22) Filed: Oct. 22, 2004

(65) Prior Publication Data
US 2006/0097798 A1 May 11, 2006

(51) Int. Cl.
H03B 5/12 (2006.01)

(52) U.S. Cl. .......................... 331/117 FE; 331/117 R; 331/177 V

(58) Field of Classification Search .......... 331/117 FE, 331/117 R, 177 V
See application file for complete search history.

(56) References Cited

U.S. PATENT DOCUMENTS 6,784,753 B1 * 8/2004 Leenaerts et al. ......... 331/36 C
6,859,109 B1 * 2/2005 Leung et al. ................. 331/46
2005/0212610 A1 * 9/2005 Brekelmans ............ 331/117 R

* cited by examiner

Primary Examiner—Joseph Chang
(74) Attorney, Agent, or Firm—Farjami & Farjami LLP

(57) ABSTRACT

According to an exemplary embodiment, a voltage controlled oscillator includes a PFET having a first gate terminal, a first source terminal, a first drain terminal, and a first body terminal, where the first source terminal is coupled to a bias voltage and the first body terminal is coupled to a first tuning voltage. The voltage controlled oscillator does not include a discrete varactor diode. The voltage controlled oscillator further includes an NFET having a second gate terminal, a second source terminal, a second drain terminal, and a second body terminal, where the second body terminal is coupled to a second tuning voltage. The first and second drain terminals drive an output of the voltage controlled oscillator, where a frequency of the output is responsive to a change in the first tuning voltage. The change in the first tuning voltage causes a change in source-to-body capacitance of the PFET.

20 Claims, 3 Drawing Sheets

VOLTAGE CONTROLLED OSCILLATOR WITH VARACTOR-LESS TUNING

BACKGROUND OF THE INVENTION

1. Field of the Invention

The present invention is generally in the field of electrical circuits. More specifically, the invention is in the field of voltage controlled oscillators.

2. Related Art

In the field of wireless communication, such as radio frequency ("RF") communication, voice and data signals are encoded over a carrier signal prior to transmission. Typically, the carrier signal used for RF communications is a sine wave generated by an oscillator. For example, a typical oscillator used to generate a sine wave for RF communication is a voltage controlled oscillator.

A conventional voltage controlled oscillator generally includes a tank circuit for establishing the oscillation frequency of the output signal generated by the voltage controlled oscillator, where the tank circuit includes a combination of inductive and capacitive components. In the conventional voltage controlled oscillator, the capacitive component typically comprises a variable capacitor, which can be adjusted to allow the output of the voltage controlled oscillator to be tuned to a desired oscillation frequency. In the conventional voltage controlled oscillator, a varactor diode, which has a capacitance that varies according to a voltage applied across the varactor diode, is typically used as the variable capacitor.

Thus, in the conventional voltage controlled oscillator, the output of the voltage controlled oscillator can be tuned by varying the voltage applied across the varactor diode.

However, the varactor diode can cause undesirable tuning non-linearity in the voltage controlled oscillator, which increases design constraints on the circuit in which the voltage controlled oscillator is typically used, such as a phase locked loop. Additionally, the varactor diode can reduce the quality factor of the voltage controlled oscillator, which can cause an increase in phase noise of the voltage controlled oscillator in the gigahertz frequency range.

Thus, there is a need in the art for a voltage controlled oscillator having reduced tuning non-linearity and increased quality factor.

SUMMARY OF THE INVENTION

The present invention is directed to voltage controlled oscillator with varactor-less tuning. The present invention addresses and resolves the need in the art for a voltage controlled oscillator having reduced tuning non-linearity and increased quality factor.

According to an exemplary embodiment, a voltage controlled oscillator includes a PFET having a first gate terminal, a first source terminal, a first drain terminal, and a first body terminal, where the first source terminal is coupled to a bias voltage and the first body terminal is coupled to a first tuning voltage. The voltage controlled oscillator does not include a varactor diode. The voltage controlled oscillator further includes an NFET having a second gate terminal, a second source terminal, a second drain terminal, and a second body terminal, where the second body terminal is coupled to a second tuning voltage. The first drain terminal and the second drain terminal drive an output of the voltage controlled oscillator, where a frequency of the output is responsive to a change in the first tuning voltage. The change in the first tuning voltage causes a change in a source-to-body capacitance of the PFET.

According to this exemplary embodiment, the frequency of the output is responsive to a change in the second tuning voltage, which causes a change in a source-to-body capacitance of the NFET. The voltage controlled oscillator further includes a tuning voltage separator circuit, where the tuning voltage separator circuit is configured to receive a third tuning voltage and output the first tuning voltage and the second tuning voltage, and where the third tuning voltage can vary between approximately zero volts and a first voltage. The first tuning voltage can vary between a second voltage and the first voltage, where the second voltage is less than the first voltage, while the second tuning voltage can vary between approximately zero volts and a third voltage, where the third voltage is greater than the second voltage and less than the first voltage.

Other features and advantages of the present invention will become more readily apparent to those of ordinary skill in the art after reviewing the following detailed description and accompanying drawings.

DETAILED DESCRIPTION OF THE INVENTION

The present invention is directed to voltage controlled oscillator with varactor-less tuning. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
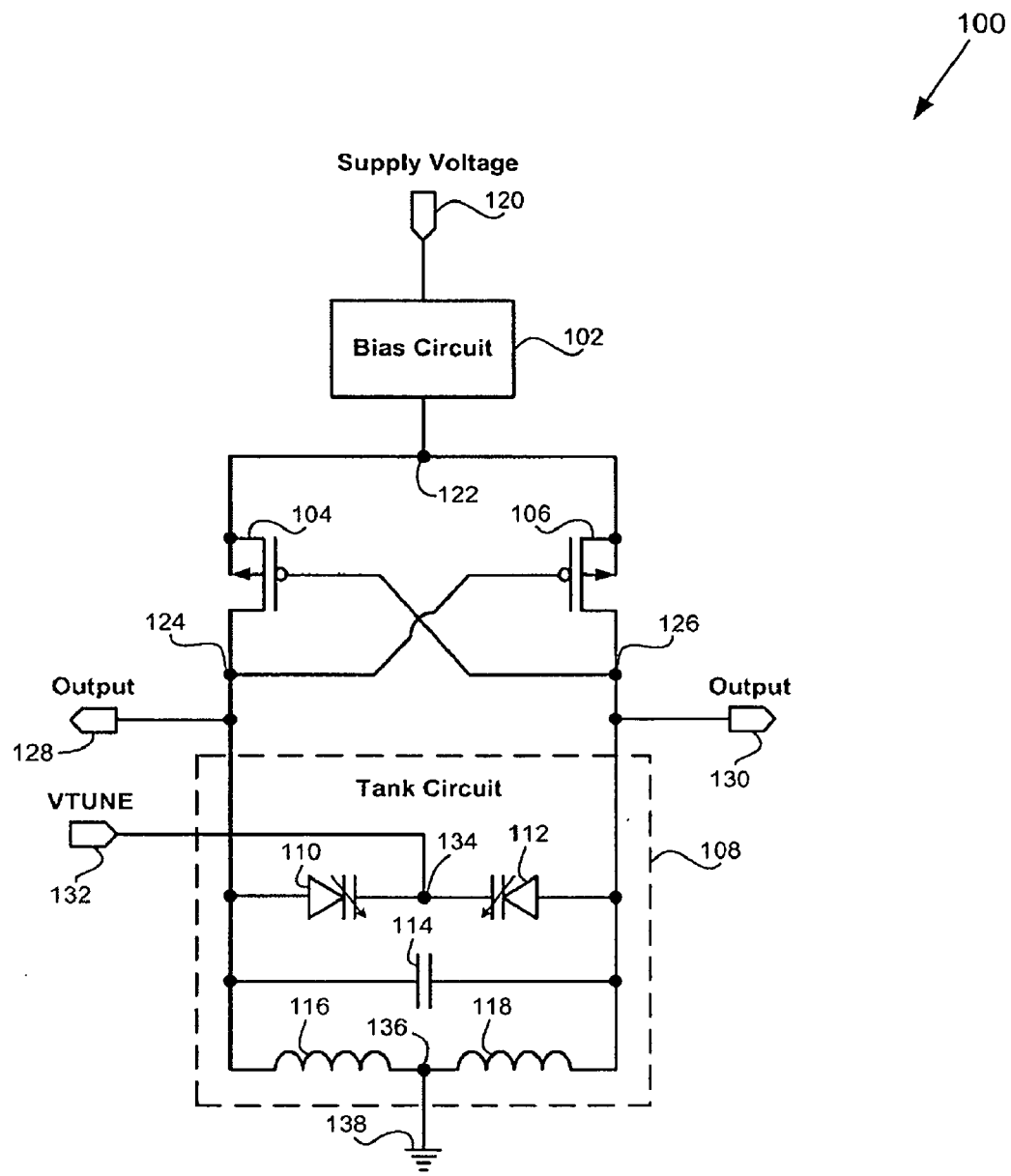
FIG. 1 illustrates a circuit diagram of an exemplary conventional voltage controlled oscillator.

FIG. 1 shows a circuit diagram of an exemplary conventional voltage controlled oscillator. Conventional voltage controlled oscillator 100 includes bias circuit 102, transistors 104 and 106, and tank circuit 108, which includes varactor diodes 110 and 112, capacitor 114, and inductors 116 and 118. Conventional voltage controlled oscillator 100 can be part of a phase locked loop, which is not shown in FIG. 1. Conventional voltage controlled oscillator 100 is provided supply voltage 120 and tuning voltage ("VTUNE") 132 and generates output 128 at node 124 and output 130 at node 126, where outputs 128 and 130 are differential outputs. For example, output 130 may be designated as the negative output of conventional voltage controlled oscillator 100, while output 128 may be designated as the positive output of conventional voltage controlled oscillator 100.

As shown in FIG. 1, supply voltage 120 is coupled to the input of bias circuit 120 and the output of bias circuit 120 is coupled to node 122. Supply voltage 120 may be a supply voltage having a constant DC voltage with no AC component, such as VDD. Bias circuit 102 can be configured to output a DC bias voltage at node 122 and can comprise, for example, a resistor or an active circuit, such as a current mirror. Also shown in FIG. 1, the body terminals and the source terminals of transistors 104 and 106 are coupled to the output of bias circuit 102 at node 122. In conventional voltage controlled oscillator 100, transistors 104 and 106 are P-channel field effect transistors ("PFET"). However, transistors 104 and 106 can also be N-channel field effect transistors ("NFET"). Transistors 104 and 106 are coupled in a symmetrical configuration and are configured to generate output signals at nodes 124 and 126, which are coupled to the respective drain terminals of transistors 104 and 106.

Further shown in FIG. 1, the drain terminal of transistor 104 is coupled to the gate terminal of transistor 106 at node 124 and the drain terminal of transistor 106 is coupled to the gate terminal of transistor 104 at node 126. Also shown in FIG. 1, the anode of varactor diode 112 is coupled to first terminals of capacitor 114 and inductor 118 at node 126 and the anode of varactor diode 110 is coupled to the second terminals of capacitor 114 and inductor 116 at node 124. Further shown in FIG. 1, the cathodes of varactor diodes 110 and 112 are coupled to VTUNE 132 at node 134 and the second terminals of inductors 116 and 118 at coupled to ground 138 at node 136.

The operation of conventional voltage controlled oscillator 100 will now be discussed. Tank circuit 108 is coupled to transistors 104 and 106 such that a feedback loop is provided between the gate terminal and drain terminal of transistor 104 and the gate terminal and drain terminal of transistor 106. As a result, transistors 104 and 106, which are coupled together in a symmetrical configuration, operate as oscillators and generate respective output signals at nodes 124 and 126, which correspond to respective outputs 128 and 130. The frequency of each output signal is controlled by the capacitance and inductance of tank circuit 108.

The capacitance of tank circuit 108 is determined by capacitor 114, which has a fixed value, and varactor diodes 110 and 112, which have variable capacitance that is controlled by the voltage supplied at node 134, e.g., by VTUNE 132. By way of background, when a voltage is applied to the "PN" junction of a varactor diode to reverse bias the "PN" junction, the varactor diode operates as a voltage controlled capacitor, where the capacitance of the varactor diode is inversely proportional to the applied voltage. Thus, VTUNE 132 can control the capacitance of varactor diodes 110 and 112 by applying an appropriate DC voltage to the cathodes of varactor diodes 110 and 112 at node 134. Thus, by controlling the capacitance of varactor diodes 110 and 112, the capacitance of tank circuit 108 and, consequently, the frequency of the output signals at nodes 124 and 126 can be controlled.

However, varactor diodes 110 and 112 can cause undesirable tuning non-linearity in conventional voltage controlled oscillator 100. Additionally, varactor diodes 110 and 112 can reduce the quality factor of conventional voltage controlled oscillator 100, which can cause an undesirable increase in phase noise at output signal frequencies in the gigahertz range.

Figure 2:
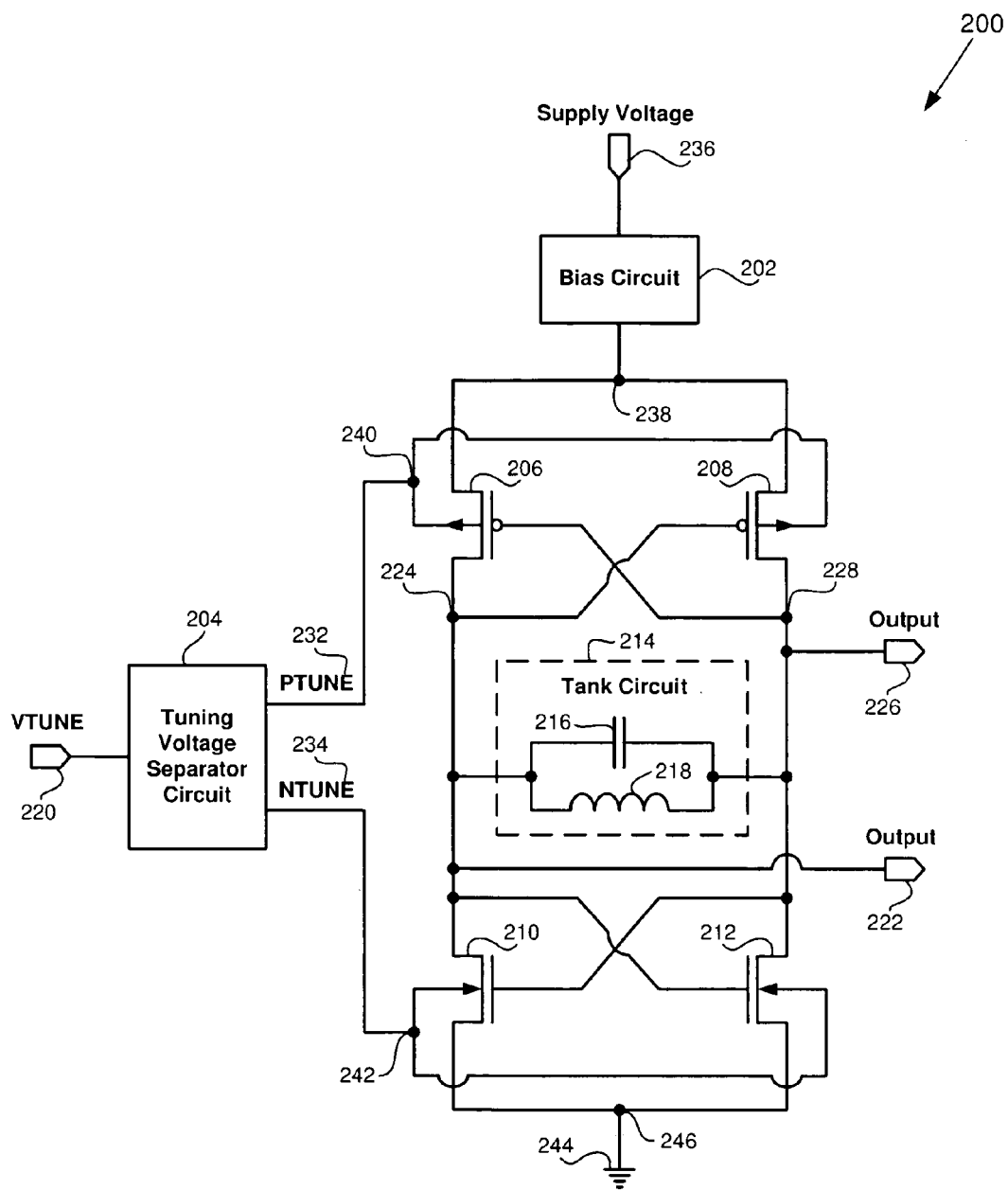
FIG. 2 illustrates a circuit diagram of an exemplary voltage controlled oscillator in accordance with one embodiment of the present invention.

FIG. 2 shows a circuit diagram of an exemplary voltage controlled oscillator in accordance with one embodiment of the present invention. Voltage controlled oscillator 200 includes bias circuit 202, tuning voltage separator circuit 204, transistors 206, 208, 210, and 212, and tank circuit 214, which includes capacitor 216 and inductor 218. Voltage controlled oscillator 200 can be part of a phase locked loop, which is not shown in FIG. 2. Voltage controlled oscillator 200 can be configured to receive tuning voltage ("VTUNE") 220 at the input of tuning voltage separator circuit 204 and generate output 222 at node 224 and output 226 at node 228, where outputs 222 and 226 are differential outputs. For example, output 222 may be designated as the negative output of voltage controlled oscillator 200, while output 226 may be designated as the positive output of voltage controlled oscillator 200.

As shown in FIG. 2, VTUNE 220 is coupled to the input of tuning voltage separator circuit 204 and can have a maximum DC voltage approximately equal to VDD and a minimum DC voltage approximately equal to zero volts. By way of example, VTUNE 220 can have a DC voltage in a range of between approximately 0.0 volts and approximately 3.0 volts. Tuning voltage separator circuit 204 can be configured to received VTUNE 220 and output P-tuning voltage ("PTUNE") 232 and N-tuning voltage ("NTUNE") 234. PTUNE 232 can have a minimum DC voltage ("Vpmin"), which can be, for example, approximately equal to 1.0 volt, and a maximum DC voltage, which is approximately equal to VDD. By way of example, PTUNE 232 can have a DC voltage in a range of between approximately 1.0 volt and approximately 3.0 volts. NTUNE 234 can have a minimum DC voltage, which is approximately equal to 0.0 volts, and a maximum DC voltage ("Vnmax"), which can be, for example, approximately 2.0 volts. Thus, for example, NTUNE 234 can have a DC voltage in a range of between approximately 0.0 volts and approximately 2.0 volts. In other embodiments, Vpmin may be equal to a DC voltage other than approximately 1.0 volt, Vnmax may be equal to a DC voltage other than approximately 2.0 volts, and VDD may be equal to a DC voltage other than approximately 3.0 volts.

Also shown in FIG. 2, supply voltage 236 is coupled to the input of bias circuit 202 and the output of bias circuit 202 is coupled to node 238. Supply voltage 236 may be a supply voltage having a constant DC voltage with no AC component, such as VDD. Bias circuit 202 can be configured to output a DC bias voltage at node 238 and can comprise, for example, a resistor, an active circuit, such as a current mirror, or other appropriate components. Also shown in FIG. 2, the source terminals of transistors 206 and 208 are coupled to a bias voltage at the output of bias circuit 202 at node 238 and the body terminals of transistors 206 and 208 are coupled to PTUNE 232, which is an output of tuning voltage separator circuit 204, at node 240. The gate terminal of transistor 206 is coupled to the drain terminal of transistor 208 at node 228 and the gate terminal of transistor 208 is coupled to the drain terminal of transistor 206 at node 224.

Transistors 206 and 208 are cross-coupled in a symmetrical configuration and can be PFETs, which are formed in an N well in a P type substrate. The N well in which transistors 206 and 208 are formed comprises the body of these transistors. By coupling PTUNE 232 to the body terminals of transistors 206 and 208, a voltage is applied to the "PN" junction, i.e. a diode, formed between the N well and the source terminal and also applied to the "PN" junction, i.e. a diode, formed between the N well and the drain terminal. By way of background, when a diode is reverse biased, the diode acts as a voltage-controlled capacitor, i.e. a varactor diode, where the diode has a "PN" junction capacitance that is inversely proportional to the reverse biasing voltage that is applied to the "PN" junction. Thus, by applying an appropriate tuning voltage, i.e. PTUNE 232, to the body terminals of transistors 206 and 208, the "PN" junctions formed between the N well and the source terminals and drain terminals of transistors 206 and 208 and the respective source and drain "PN" junction capacitances, i.e. the source-to-body and the drain-to-body capacitances, can be controlled. By utilizing PTUNE 232 to control the source-to-body and drain-to-body capacitance of transistors 206 and 208, the frequency of the output signals at node 224 (corresponding to output 222) and at node 228 (corresponding to output 226) can be correspondingly controlled.

Also shown in FIG. 2, a first terminal of capacitor 216 and a first terminal of inductor 218 are coupled to the drain terminals of transistors 206 and 210 at node 224 and a second terminal of capacitor 216 and a second terminal of inductor 218 are coupled to the drain terminals of transistor 208 and 212 at node 228. The values of capacitor 216 and inductor 218 are determined by the desired frequency range of voltage controlled oscillator 200. Further shown in FIG. 2, the gate terminal of transistor 210 is coupled to the drain terminal of transistor 212 at node 228 and the gate terminal of transistor 212 is coupled to the drain terminal of transistor 210 at node 224. The body terminals of transistors 210 and 212 are coupled to NTUNE 234 at node 242 and the sources of transistors 210 and 212 are coupled to ground 244 at node 246.

Transistors 210 and 212 are cross-coupled in a symmetrical configuration and can be NFETs, which are formed in a P well. The P well in which transistors 210 and 212 are formed comprises the body of these transistors and is situated in an N well, which is formed in a P type substrate. Thus, transistors 210 and 212 are situated in a triple well, which includes the P well and the N well in which the P well is situated. By coupling NTUNE 234 to the body terminals of transistors 210 and 212, a voltage is applied to the "PN" junction, i.e. a diode, formed between the P well and the source terminal and also applied to the "PN" junction, i.e. a diode, formed between the P well and the drain terminal.

By applying an appropriate tuning voltage, i.e. NTUNE 234, to the body terminals of transistors 206 and 208, the "PN" junctions formed between the P well and the source terminals and drain terminals of transistors 210 and 212 and the respective source and drain "PN" junction capacitances, i.e. the source-to-body and drain-to-body capacitances, can be controlled. By utilizing NTUNE 234 to control the source-to-body and drain-to-body capacitance of transistors 210 and 212, the frequency of the output signals at node 224 (corresponding to output 222) and at node 228 (corresponding to output 226) can be correspondingly controlled.

Thus, as discussed above, PTUNE 232 and NTUNE 234 can be utilized to control the frequency of the output signals at node 224 and at node 228 by controlling the respective source-to-body and drain-to-body capacitances of transistors 206 and 208 and transistors 210 and 212.

The operation of voltage controlled oscillator 200 will now be discussed. Tank circuit 214 is coupled to transistors 206 and 208 and transistors 210 and 212 such as to complement the feedback loop between the gate and drain terminals of transistors 206, 208, 210, and 212. As a result, transistors 206 and 208, transistors 210 and 212, and tank circuit 214 form an oscillator that generates output signals at node 224 (corresponding to output 222) and at node 228 (corresponding to output 226). The frequency of the output signals is determined by the capacitance and inductance of tank circuit 214, the source-to-body and drain-to-body capacitance of transistors 206 and 208, which is controlled by the tuning voltage applied to the body terminals of transistors 206 and 208 by PTUNE 232, and the source-to-body and drain-to-body capacitance of transistors 210 and 212, which is controlled by the tuning voltage applied to the body terminals of transistors 210 and 212 by NTUNE 234.

Since the capacitance of tank circuit 214 is determined by capacitor 216, which has a fixed value, and the inductance of tank circuit 214 is determined by inductor 218, which also has a fixed value, only the source-to-body and drain-to-body capacitance of transistors 206, 208, 210, and 212 is variable. However, the source-to-body and drain-to-body capacitance of transistors 206 and 208 can be controlled by controlling the DC voltage applied to the body terminals of transistors 206 and 208 by PTUNE 232 and the source-to-body and drain-to-body capacitance of transistors 210 and 212 can be controlled by controlling the DC voltage applied to the body terminals of transistors 210 and 212 by NTUNE 234. Thus, by utilizing PTUNE 232 to appropriately control the source-to-body and drain-to-body capacitance of transistors 206 and 208 and NTUNE 234 to appropriately control the source-to-body and drain-to-body capacitance of transistors 210 and 212, the frequency of the output signals at nodes 224 and 228 can be controlled.

Figure 3:
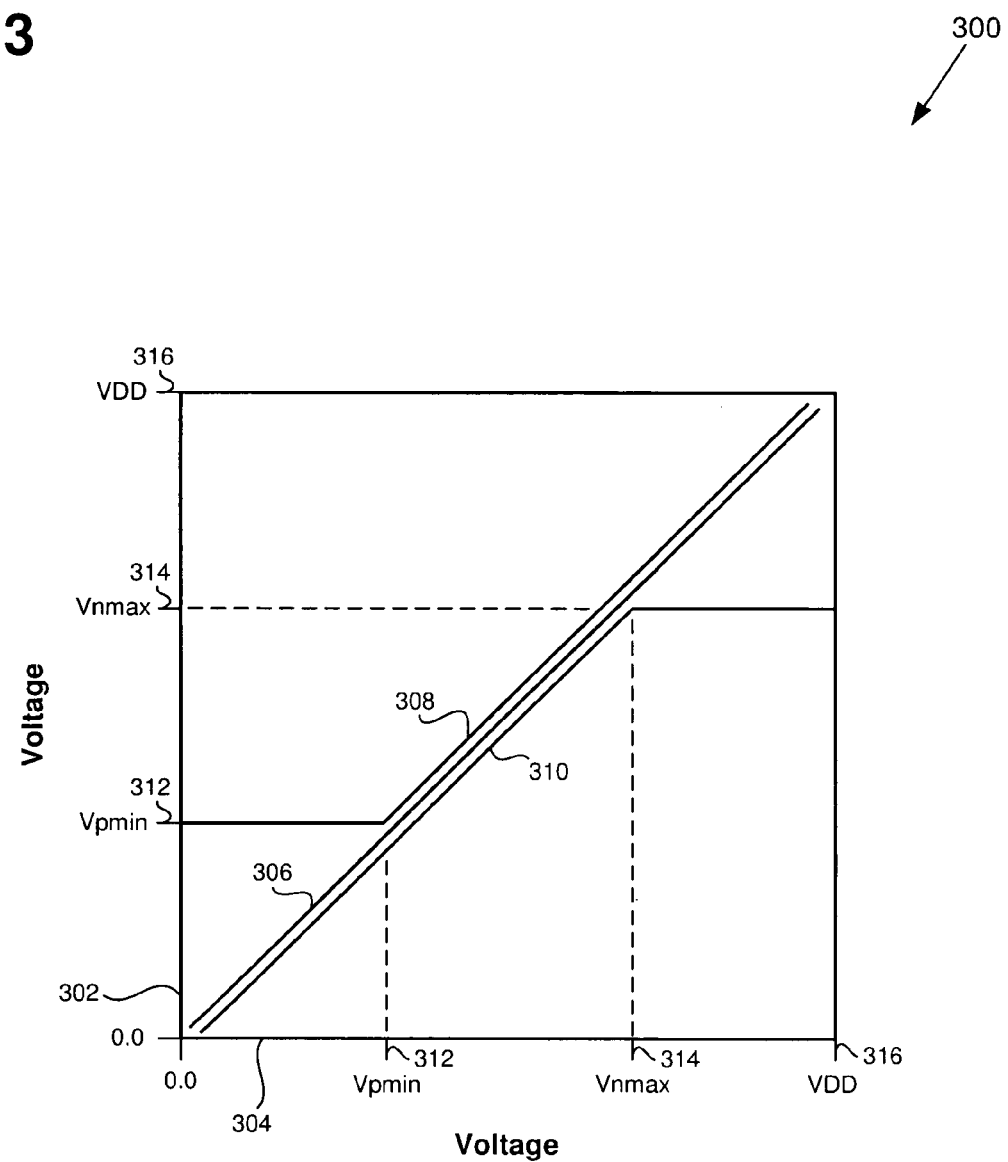
FIG. 3 is a graph showing an exemplary DC transfer characteristic of an exemplary tuning voltage separator circuit in accordance with one embodiment of the present invention.

FIG. 3 shows exemplary graph 300 including exemplary input and output DC voltage curves of an exemplary tuning voltage separator circuit in accordance with one embodiment of the present invention. Graph 300 includes voltages axis 302, voltage axis 304, and DC voltage variation curves 306, 308, and 310. Voltage axis 304 and voltage axis 306 correspond to an exemplary voltage range of VTUNE 220 in FIG. 2, which is an input of tuning voltage separator circuit 204. DC voltage input curve 306 corresponds to an exemplary DC voltage range of VTUNE 220 and DC voltage output curves 308 and 310 correspond to exemplary DC voltage ranges of PTUNE 232 and NTUNE 234, respectively, which are outputs of tuning voltage separator circuit 204. Thus, DC voltage input curve 306 and DC voltage output curves 308 and 310 show the DC transfer characteristic of tuning voltage separator circuit 204.

In the example shown in graph 300, DC voltage output curves 308 and 310 are plotted as a function of DC voltage input curve 306, which varies between approximately 0.0 volts and VDD. In graph 300, DC voltage output curve 310 tracks DC voltage input curve 306 as DC voltage input curve 306 increases between approximately 0.0 volts and Vnmax 314. As DC voltage input curve 306 increases from Vnmax 314 to VDD 316, DC voltage output curve 310 remains at Vnmax 314. By way of example, Vnmax 314 can be approximately 2.0 volts while VDD 316 can be approximately 3.0 volts.

In the example shown in graph 300, DC voltage output curve 308 remains at Vpmin 312 while DC voltage input curve 306 increases between approximately 0.0 volts and Vpmin 312. When DC voltage input curve 306 reaches Vpmin 312, DC voltage output curve 308 tracks DC voltage input curve 306 as DC voltage input curve 306 increases between Vpmin 312 and VDD 316. By way of example, Vpmin 312 can be approximately 1.0 volt.

Thus, since DC voltage output curves 308 and 310 correspond to exemplary voltage ranges of PTUNE 232 and NTUNE 234, respectively, between approximately 0.0 volts and Vpmin 312, a change in voltage of NTUNE 234 causes a corresponding change in the frequency of outputs 222 and 226 of voltage controlled oscillator 200 in FIG. 2. Also, between Vpmin 312 and Vnmax 314, changes in the voltage of PTUNE 232 and NTUNE 234 cause a corresponding change in the frequency of outputs 222 and 226. Further, between Vnmax 314 and VDD 316, a change in voltage of PTUNE 232 between causes a corresponding change in the frequency of outputs 222 and 226.

As discussed above, the present invention utilizes a tuning voltage separator circuit, i.e. tuning voltage separator circuit 204, to receive a tuning voltage input, i.e. VTUNE 220, and output a P-tuning voltage, i.e. PTUNE 232, and an N-tuning voltage, i.e. NTUNE 234. By utilizing PTUNE 232 to control the source-to-body and drain-to-body capacitance of cross-coupled transistors 206 and 208 and utilizing NTUNE 234 to control the source-to-body and drain-to-body capacitance of cross-coupled transistors 210 and 212, the present invention advantageously achieves control of the frequency of the outputs 222 and 226 of voltage controlled oscillator 200.

Furthermore, in contrast to conventional voltage controlled oscillator 100 in FIG. 1, the present invention advantageously achieves control of the output frequency of voltage controlled oscillator 200 without the use of discrete varactor diodes, such as varactor diodes 110 and 112 in FIG. 1. Further, the present invention advantageously achieves a voltage controlled oscillator having increased tuning linearity compared to a conventional voltage controlled oscillator using varactor diode tuning, such as conventional voltage controlled oscillator 100 in FIG. 1. Additionally, the present invention's voltage controlled oscillator has an increased quality factor compared to a conventional voltage controlled oscillator using varactor diode tuning.

Moreover, the present invention provides a voltage controlled oscillator, such as voltage controlled oscillator 200, having cross-coupled PFETs, i.e. transistors 206 and 208, coupled to cross-coupled NFETs, i.e. transistors 210 and 212. By providing a voltage controlled oscillator having cross-coupled PFETs coupled to cross-coupled NFETs, the present invention advantageously achieves a voltage-controlled oscillator having increased noise canceling properties.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, voltage controlled oscillator with varactor-less tuning has been described.

The invention claimed is:

1. A voltage controlled oscillator comprising:
a PFET having a first gate terminal, a first source terminal, a first drain terminal, and a first body terminal, wherein said first source terminal is coupled to a bias voltage and said first body terminal is coupled to a first tuning voltage;
an NFET having a second gate terminal, a second source terminal, a second drain terminal, and a second body terminal, wherein said second body terminal is coupled to a second tuning voltage;
said first drain terminal and said second drain terminal driving an output of said voltage controlled oscillator, wherein a frequency of said output is responsive to a change in said first tuning voltage, and wherein said change in said first tuning voltage causes a change in a source-to-body capacitance of said PFET.

2. The voltage controlled oscillator of claim 1 wherein said frequency of said output is responsive to a change in said second tuning voltage.

3. The voltage controlled oscillator of claim 2 wherein said change in said second tuning voltage causes a change in a source-to-body capacitance of said NFET.

4. The voltage controlled oscillator of claim 1 wherein said change in said first tuning voltage causes a change in a drain-to-body capacitance of said PFET.

5. The voltage controlled oscillator of claim 2 wherein said change in said second tuning voltage causes a change in a drain-to-body capacitance of said NFET.

6. The voltage controlled oscillator of claim 1 further comprising a tuning voltage separator circuit, said tuning voltage separator circuit being configured to receive a third tuning voltage and output said first tuning voltage and said second tuning voltage, wherein said third tuning voltage varies between approximately zero volts and a first voltage.

7. The voltage controlled oscillator of claim 6 wherein said first tuning voltage varies between a second voltage and said first voltage, wherein said second voltage is less than said first voltage.

8. The voltage controlled oscillator of claim 7 wherein said second tuning voltage varies between approximately zero volts and a third voltage, wherein said third voltage is greater than said second voltage and less than said first voltage.

9. The voltage controlled oscillator of claim 1 wherein said voltage controlled oscillator does not comprise a discrete varactor diode.

10. A voltage controlled oscillator having a first output and a second output, said first output and said second output having a frequency, said voltage controlled oscillator comprising:
a first PFET having a first gate terminal, a first source terminal, a first drain terminal, and a first body terminal, wherein said first source terminal is coupled to a bias voltage and said first body terminal is coupled to a first tuning voltage;
a second PFET having a second gate terminal, a second source terminal, a second drain terminal, and a second body terminal, wherein said second source terminal is coupled to said bias voltage and said second body terminal is coupled to said first tuning voltage;
a first NFET having a third gate terminal, a third source terminal, a third drain terminal, and a third body terminal, wherein said third body terminal is coupled to a second tuning voltage;
a second NFET having a fourth gate terminal, a fourth source terminal, a fourth drain terminal, and a fourth body terminal, wherein said fourth body terminal is coupled to said second tuning voltage;
said first drain terminal and said third drain terminal driving said first output of said voltage controlled oscillator, wherein said frequency of said first output and said second output is responsive to a change in said first tuning voltage, wherein said change in said first tuning voltage causes a change in a source-to-body capacitance of said first PFET and a change in a source-to-body capacitance of said second PFET.

11. The voltage controlled oscillator of claim 10 wherein said frequency of said first output and said second output is responsive to a change in said second tuning voltage.

12. The voltage controlled oscillator of claim 10 wherein said second drain terminal and said fourth drain terminal drive said second output of said voltage controlled oscillator.

13. The voltage controlled oscillator of claim 11 wherein said change in said second tuning voltage causes a change in a source-to-body capacitance of said first NFET and a change in a source-to-body capacitance of said second NFET.

14. The voltage controlled oscillator of claim 10 wherein said change in said first tuning voltage causes a change in a drain-to-body capacitance of said first PFET and a change in a drain-to-body capacitance of said second PFET.

15. The voltage controlled oscillator of claim 10 further comprising a tuning voltage separator circuit, said tuning voltage separator circuit being configured to receive a third tuning voltage and output said first tuning voltage and said second tuning voltage, wherein said third tuning voltage varies between approximately zero volts and a first voltage.

16. The voltage controlled oscillator of claim 15 wherein said first tuning voltage varies between a second voltage and said first voltage, wherein said second voltage is less than said first voltage.

17. The voltage controlled oscillator of claim 16 wherein said second tuning voltage varies between approximately zero volts and a third voltage, wherein said third voltage is greater than said second voltage and less than said first voltage.

18. The voltage controlled oscillator of claim 10 wherein said voltage controlled oscillator does not comprise a discrete varactor diode.

19. A voltage controlled oscillator comprising:

a PFET having a first gate terminal, a first source terminal, a first drain terminal, and a first body terminal, wherein said first source terminal is coupled to a bias voltage and said first body terminal is coupled to a first tuning voltage;

an NFET having a second gate terminal, a second source terminal, a second drain terminal, and a second body terminal, wherein said second body terminal is coupled to a second tuning voltage;

a tuning voltage separator circuit, said tuning voltage separator circuit being configured to receive a third tuning voltage and output said first tuning voltage and said second tuning voltage, wherein said third tuning voltage varies between approximately zero volts and a first voltage;

said first drain terminal and said second drain terminal driving an output of said voltage controlled oscillator, wherein a frequency of said output is responsive to a change in said first tuning voltage.

20. The voltage controlled oscillator of claim 19 wherein said first tuning voltage varies between a second voltage and said first voltage, wherein said second voltage is less than said first voltage.

* * * * *